(12) United States Patent
Michaelson

(10) Patent No.: US 7,479,062 B2
(45) Date of Patent: *Jan. 20, 2009

(54) APPARATUS AND METHOD FOR GENERATING A POOL OF SEEDS FOR A CENTRAL DETERMINATION GAMING SYSTEM

(75) Inventor: Richard E. Michaelson, Reno, NV (US)

(73) Assignee: IGT, Reno, NV (US)

( * ) Notice: Subject to any disclaimer, the term of this patent is extended or adjusted under 35 U.S.C. 154(b) by 801 days.

This patent is subject to a terminal disclaimer.

(21) Appl. No.: 11/071,372

(22) Filed: Mar. 2, 2005

(65) Prior Publication Data

US 2005/0148385 A1 Jul. 7, 2005

Related U.S. Application Data

(63) Continuation of application No. 10/371,722, filed on Feb. 21, 2003, now Pat. No. 6,866,584.

(51) Int. Cl.
A63F 13/00 (2006.01)
(52) U.S. Cl. .............................. 463/21; 708/254; 463/42
(58) Field of Classification Search ............. 463/20–25, 463/29, 42; 708/250, 254
See application file for complete search history.

(56) References Cited

U.S. PATENT DOCUMENTS

| | | | |
|---|---|---|---|
| 4,157,829 A | 6/1979 | Goldman et al. | |
| 4,332,389 A | 6/1982 | Loyd et al. | |
| 4,365,810 A | 12/1982 | Richardson | |
| 4,373,726 A | 2/1983 | Churchill et al. | |

(Continued)

FOREIGN PATENT DOCUMENTS

GB 2 374 294 A 10/2002

(Continued)

OTHER PUBLICATIONS

Lucky Time California Lottery Newsletter published in 1996.

(Continued)

*Primary Examiner*—Scott E Jones
(74) *Attorney, Agent, or Firm*—Bell, Boyd & Lloyd LLP

(57) ABSTRACT

An apparatus and method for generating one or more pools or sets of seeds for use in a central determination gaming system. In one embodiment of the present invention, a processor of the apparatus or seed generator randomly generates a predetermined number of random number seeds. After the predetermined number of seeds are generated, the processor simulates the game outcome value that each generated seed ultimately determines. Having simulated a game outcome value for each generated seed, the processor determines if the set of seeds satisfies a required condition or criteria. If the required conditions or criteria are satisfied, the set is complete and ready for use in a central determination gaming system. If the required conditions or criteria are not satisfied, the processor modifies the generated set of seeds until the required conditions or criteria are satisfied.

39 Claims, 4 Drawing Sheets

U.S. PATENT DOCUMENTS

| | | | |
|---|---|---|---|
| 4,448,419 A | 5/1984 | Telnaes |
| 4,455,025 A | 6/1984 | Itkis |
| 4,494,197 A | 6/1985 | Troy et al. |
| 4,527,798 A | 7/1985 | Siekierski et al. |
| 4,582,324 A | 4/1986 | Koza et al. |
| 4,624,462 A | 11/1986 | Itkis |
| 4,636,951 A | 1/1987 | Harlick |
| 4,652,998 A | 3/1987 | Koza et al. |
| 4,669,730 A | 6/1987 | Small |
| 4,679,143 A | 7/1987 | Hagiwara |
| 4,689,742 A | 8/1987 | Troy et al. |
| 4,798,387 A | 1/1989 | Richardson |
| 4,817,951 A | 4/1989 | Crouch et al. |
| 4,842,278 A | 6/1989 | Markowicz |
| 4,848,771 A | 7/1989 | Richardson |
| 4,856,787 A | 8/1989 | Itkis |
| 4,880,237 A | 11/1989 | Kishishita |
| 4,882,473 A | 11/1989 | Bergeron et al. |
| 4,982,337 A | 1/1991 | Burr et al. |
| 5,007,649 A | 4/1991 | Richardson |
| 5,042,809 A | 8/1991 | Richardson |
| 5,092,598 A | 3/1992 | Kamille |
| 5,100,139 A | 3/1992 | Di Bella |
| 5,119,295 A | 6/1992 | Kapur |
| 5,158,293 A | 10/1992 | Mullins |
| 5,223,698 A | 6/1993 | Kapur |
| 5,265,874 A | 11/1993 | Dickinson et al. |
| 5,275,400 A | 1/1994 | Weingardt et al. |
| 5,282,620 A | 2/1994 | Keesee |
| 5,297,802 A | 3/1994 | Pocock et al. |
| 5,324,035 A | 6/1994 | Morris et al. |
| 5,326,104 A | 7/1994 | Pease et al. |
| 5,348,299 A | 9/1994 | Clapper, Jr. |
| 5,351,970 A | 10/1994 | Fioretti |
| 5,377,975 A | 1/1995 | Clapper, Jr. |
| 5,393,061 A | 2/1995 | Manship et al. |
| 5,407,199 A | 4/1995 | Gumina |
| 5,476,259 A | 12/1995 | Weingardt |
| 5,487,544 A | 1/1996 | Clapper, Jr. |
| 5,536,008 A | 7/1996 | Clapper, Jr. |
| 5,542,669 A | 8/1996 | Charron et al. |
| 5,562,284 A | 10/1996 | Stevens |
| 5,564,701 A | 10/1996 | Dettor |
| 5,580,311 A | 12/1996 | Haste, III |
| 5,586,937 A | 12/1996 | Menashe |
| 5,595,538 A | 1/1997 | Haste, III |
| 5,609,337 A | 3/1997 | Clapper, Jr. |
| 5,628,684 A | 5/1997 | Bouedec |
| 5,630,754 A | 5/1997 | Rebane |
| 5,645,485 A | 7/1997 | Clapper, Jr. |
| 5,657,899 A | 8/1997 | Stoken |
| 5,697,843 A | 12/1997 | Manship et al. |
| 5,720,483 A | 2/1998 | Trinh |
| 5,735,432 A | 4/1998 | Stoken et al. |
| 5,749,784 A | 5/1998 | Clapper, Jr. |
| 5,779,545 A | 7/1998 | Berg et al. |
| 5,779,547 A | 7/1998 | SoRelle et al. |
| 5,810,664 A | 9/1998 | Clapper, Jr. |
| 5,830,067 A | 11/1998 | Graves et al. |
| 5,855,515 A | 1/1999 | Pease et al. |
| 5,871,398 A | 2/1999 | Schneier et al. |
| 5,876,283 A | 3/1999 | Parra et al. |
| 5,882,260 A | 3/1999 | Marks et al. |
| 5,915,588 A | 6/1999 | Stoken et al. |
| 5,928,082 A | 7/1999 | Clapper, Jr. |
| 5,941,771 A | 8/1999 | Haste, III |
| 5,944,606 A | 8/1999 | Gerow |
| 5,949,042 A | 9/1999 | Dietz, II et al. |
| 5,970,143 A | 10/1999 | Schneier et al. |
| 5,980,385 A | 11/1999 | Clapper, Jr. |
| 5,984,779 A | 11/1999 | Bridgeman et al. |
| 6,012,984 A | 1/2000 | Roseman |
| 6,017,032 A | 1/2000 | Grippo et al. |
| 6,024,640 A | 2/2000 | Walker et al. |
| 6,056,289 A | 5/2000 | Clapper, Jr. |
| 6,062,981 A | 5/2000 | Luciano, Jr. |
| 6,079,711 A | 6/2000 | Wei et al. |
| 6,093,100 A | 7/2000 | Singer et al. |
| 6,099,408 A | 8/2000 | Schneier et al. |
| 6,117,009 A | 9/2000 | Yoseloff |
| 6,120,024 A | 9/2000 | Lind |
| 6,155,925 A | 12/2000 | Giobbi et al. |
| 6,159,095 A | 12/2000 | Frohm et al. |
| 6,174,233 B1 | 1/2001 | Sunaga et al. |
| 6,183,361 B1 | 2/2001 | Cummings et al. |
| 6,210,275 B1 | 4/2001 | Olsen |
| 6,210,276 B1 | 4/2001 | Mullins |
| 6,220,961 B1 | 4/2001 | Keane et al. |
| 6,241,606 B1 | 6/2001 | Riendeau et al. |
| 6,250,685 B1 | 6/2001 | Walker et al. |
| 6,254,480 B1 | 7/2001 | Zach |
| 6,272,223 B1 | 8/2001 | Carlson |
| 6,280,325 B1 | 8/2001 | Fisk |
| 6,302,791 B1 | 10/2001 | Frohm et al. |
| 6,306,038 B1 | 10/2001 | Graves et al. |
| 6,309,298 B1 | 10/2001 | Gerow |
| 6,315,289 B1 | 11/2001 | Sakamoto et al. |
| 6,358,150 B1 | 3/2002 | Mir et al. |
| 6,358,151 B1 | 3/2002 | Enzminger et al. |
| 6,368,218 B2 | 4/2002 | Angell, Jr. |
| 6,386,977 B1 | 5/2002 | Hole |
| 6,402,614 B1 | 6/2002 | Schneier et al. |
| 6,419,583 B1 | 7/2002 | Crumby et al. |
| 6,428,413 B1 | 8/2002 | Carlson |
| 6,443,837 B1 | 9/2002 | Jaffe et al. |
| 6,447,395 B1 | 9/2002 | Stevens |
| 6,471,591 B1 | 10/2002 | Crumby |
| 6,502,116 B1 | 12/2002 | Kelly et al. |
| 6,524,184 B1 | 2/2003 | Lind et al. |
| 6,524,185 B2 | 2/2003 | Lind |
| 6,533,664 B1 | 3/2003 | Crumby |
| 6,537,150 B1 | 3/2003 | Luciano et al. |
| 6,569,017 B2 | 5/2003 | Enzminger et al. |
| 6,599,187 B2 | 7/2003 | Gerow |
| 6,656,040 B1 | 12/2003 | Brosnan et al. |
| 6,656,044 B1 | 12/2003 | Lewis |
| 6,728,740 B2 | 4/2004 | Kelly et al. |
| 6,729,961 B1 | 5/2004 | Millerschone |
| 6,749,500 B1 | 6/2004 | Nelson et al. |
| 2002/0039917 A1 | 4/2002 | Armstrong et al. |
| 2002/0040347 A1 | 4/2002 | Murakami et al. |
| 2002/0072404 A1 | 6/2002 | Gerow |
| 2002/0077173 A1 | 6/2002 | Luciano et al. |
| 2002/0077174 A1 | 6/2002 | Luciano et al. |
| 2002/0082070 A1 | 6/2002 | Macke et al. |
| 2002/0082071 A1 | 6/2002 | Riendeau et al. |
| 2002/0082085 A1 | 6/2002 | Osterer |
| 2002/0090986 A1 | 7/2002 | Cote et al. |
| 2002/0094871 A1 | 7/2002 | Luciano et al. |
| 2002/0098882 A1 | 7/2002 | Lind et al. |
| 2002/0111207 A1 | 8/2002 | Lind et al. |
| 2002/0111214 A1 | 8/2002 | Lind et al. |
| 2002/0113369 A1 | 8/2002 | Weingardt |
| 2002/0132661 A1 | 9/2002 | Lind et al. |
| 2002/0132666 A1 | 9/2002 | Lind et al. |
| 2002/0169018 A1 | 11/2002 | Schneier et al. |
| 2003/0100371 A1 | 5/2003 | Gatto et al. |
| 2003/0100372 A1 | 5/2003 | Gatto et al. |

| | | |
|---|---|---|
| 2003/0125101 A1 | 7/2003 | Campo |
| 2003/0181231 A1 | 9/2003 | Vancura et al. |
| 2003/0193136 A1 | 10/2003 | Walker et al. |
| 2003/0211884 A1 | 11/2003 | Gauselmann |

FOREIGN PATENT DOCUMENTS

| WO | WO 00/67424 | 11/2000 |
|---|---|---|
| WO | WO 02/97749 A2 | 12/2002 |

OTHER PUBLICATIONS

Instant Winner Advertisement by Williams/WMS Gaming, published prior to 2002.

APPARATUS AND METHOD FOR GENERATING A POOL OF SEEDS FOR A CENTRAL DETERMINATION GAMING SYSTEM

PRIORITY CLAIM

This application is a continuation of and claims the benefit of U.S. patent application Ser. No. 10/371,722, filed Feb. 21, 2003, now U.S. Pat. No. 6,866,584, the contents of which is incorporated herein.

CROSS-REFERENCE TO RELATED APPLICATIONS

This application relates to the following co-pending commonly owned patent applications: "GAMING DEVICE INCLUDING OUTCOME POOLS FOR PROVIDING GAME OUTCOMES," Ser. No. 10/261,744; "CENTRAL DETERMINATION GAMING SYSTEM WITH A CENTRAL CONTROLLER PROVIDING A GAME OUTCOME AND A GAMING TERMINAL DETERMINING A PRESENTATION OF THE PROVIDED GAME OUTCOME," Ser. No. 10/371,723; "CENTRAL DETERMINATION GAMING SYSTEM WHERE THE SAME SEED IS USED TO GENERATE THE OUTCOMES FOR A PRIMARY GAME AND A SECONDARY GAME," Ser. No. 10/371,958; "CENTRAL DETERMINATION GAMING SYSTEM WHICH PROVIDES A PLAYER A CHOICE IN OUTCOMES," Ser. No. 10/442,318; "CENTRAL DETERMINATION GAMING SYSTEM WITH A GAME OUTCOME GENERATED BY A GAMING TERMINAL AND APPROVED BY A CENTRAL CONTROLLER," Ser. No. 10/383,423; "CENTRAL DETERMINATION GAMING SYSTEM WITH A GAMING TERMINAL ASSISTING THE CENTRAL CONTROLLER IN THE GENERATION OF A GAME OUTCOME," Ser. No. 10/431,755, "CENTRAL DETERMINATION GAMING SYSTEM WITH A KENO GAME," Ser. No. 10/601,482; "GAMING DEVICE HAVING AN INTERACTIVE POKER GAME WITH PREDETERMINED OUTCOMES," Ser. No. 10/934,258; "CENTRAL DETERMINATION POKER GAME," Ser. No. 10/945,642; "GAMING DEVICE HAVING A PREDETERMINED RESULT POKER GAME," Ser. No. 11/031,663; "CENTRAL DETERMINATION OFFER AND ACCEPTANCE GAME WITH MULTIPLIER," Ser. No. 11/048,220; "APPARATUS AND METHOD FOR GENERATING A POOL OF SEEDS FOR A CENTRAL DETERMINATION GAMING SYSTEM," Ser. No. 11/11/046,354; "METHOD FOR DISPLAYING AN INTERACTIVE GAME HAVING A PREDETERMINED OUTCOME," Ser. No. 10/829,578; "METHOD FOR DISPLAYING AN INTERACTIVE GAME HAVING A PREDETERMINED OUTCOME," Ser. No. 10/846,448; and "METHOD FOR DISPLAYING AN INTERACTIVE GAME HAVING A PREDETERMINED OUTCOME," Ser. No. 10/864,784.

COPYRIGHT NOTICE

A portion of the disclosure of this patent document contains or may contain material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever.

BACKGROUND OF THE INVENTION

The present invention relates to an apparatus and method for generating a pool of seeds for a central determination gaming system. The majority of the contemporary wagering gaming devices, such as slot machines, randomly generate awards and other outcomes. Such gaming devices typically include a relatively low probability associated with obtaining the highest award, relatively medium probabilities associated with obtaining medium range awards and relatively higher probabilities associated with obtaining low range awards. These gaming machines also include probabilities associated with obtaining losses or no award at all. The probabilities of obtaining the awards and the amount of the awards determine the average expected pay out percentage of these wagering gaming machines. Because the outcomes of these gaming devices are completely randomly determined, there is no certainty that a player will ever obtain any particular award. That is, no matter how many times a player plays the game, since the gaming device generates outcomes randomly or completely based upon a probability calculation, there is no certainty that the game will ever provide the player with a rare outcome, such as a jackpot award, or any other specific value for that matter. On the other hand, due to the random determination, the gaming machine can provide the rare outcomes, such as jackpot awards, numerous times in a small number of plays.

This uncertainty is faced by players and casinos or other gaming establishments. For example, certain casinos prefer that a relatively high number of players hit low awards while a relatively low number of players hit high awards. When players hit high awards periodically, casinos attract more players, because of the positive publicity large wins generate. By using desired payback percentages or probabilities, the casinos can also expect to make a certain level of profit. The random determinations can, however, unexpectedly cause casinos to suffer a loss or, on the other hand, to reap great profit in the short run and lose business in the long run due to a reputation for only paying out low awards.

Regulatory bodies in certain jurisdictions do not permit the use of probability-based gaming devices in-part for these reasons. These regulatory bodies permit the use of wagering gaming devices which are guaranteed to provide certain or definite awards, so that, for example, a certain number of wins is guaranteed and the overall amount paid back to players is guaranteed. That is, the payback percentage is fixed and not an average expected amount. One type of gaming device which complies with this requirement is an instant-type lottery gaming machine. An instant-type lottery gaming machine includes a finite pool or set of electronic tickets with each electronic ticket assigned to a predetermined outcome. Each predetermined outcome may for instance include a win/loss component and a value component. A value could include any positive number of credits or currency units, zero credits or currency units or any negative number of credits or currency units. Alternatively, each electronic ticket could be assigned to a predetermined number seed. Each number seed is deterministic of a predetermined outcome. That is, the gaming machine utilizes the number seed in a random number generator to generate random numbers that the gaming machine then uses to determine and provide the predetermined outcome. In an instant-type lottery gaming machine, as the predetermined outcome for each electronic ticket is revealed to a player on the gaming machine, the ticket is removed (i.e., flagged as used) from the finite pool or set of electronic tickets. Once removed from the pool or set, a ticket cannot be used again to determine another game outcome. This type of gaming machine provides players with all of the available outcomes over the course of the play cycle and guarantees the actual wins and losses.

Since an instant-type lottery gaming machine has a finite pool of predetermined win/loss outcomes, it is possible to configure the pool to specific conditions or criteria requested by the casino or gaming establishment. An example of these conditions or criteria are the number of tickets included in the pool and the exact payback percentage or payback sum for the pool as a whole. The payback percentage or sum represents the guaranteed payout for the entire pool of predetermined outcomes. Other examples of conditions or criteria are what prizes will be awarded and the frequency of winning outcome tickets amongst the total number of tickets for the pool. For example, if a predetermined pool includes twenty $1 tickets and the pool has a payback sum of $10, then the pool might consist of one $5 win outcome, one $2 win outcome, three $1 win outcomes and fifteen $0 loss outcomes and may be represented as the following outcomes: 5, 2, 1, 1, 1, 0, 0, 0, 0, 0, 0, 0, 0, 0, 0, 0, 0, 0, 0, 0. It should be appreciated that the above described pool of twenty tickets is for illustration purposes only and a pool could include any suitable desired number of tickets including a large number such as one million or more.

Even though a pool may contain more than one of the same game outcome (i.e., the loss or the win and if a win, the value), the presentation to the player (such as reel stops in the case of slot machines or simulated slot machines, cards dealt or drawn in the case of simulated card games and the like) is preferably varied for each sequential game outcome. For example, in the twenty ticket pool described above, while three game outcomes may each determine a win game outcome with a value of $1, in a slot machine type game each game outcome will be preferably presented to the player as multiple different or all different winning combinations of reel symbols.

Additionally, central determination gaming systems are generally known. A central determination gaming system provides a plurality of individual gaming terminals, located in a gaming establishment, such as a casino, coupled by one or more communication links, to a central processor or computing system. When a player plays a game on one of the gaming terminals, the game outcome is communicated from the central system to individual gaming terminals and then provided to the player.

In order to comply with the above mentioned regulatory rules that do not permit the use of probability-based gaming devices, central determination gaming systems have been implemented wherein the central system maintains one or more predetermined pools or sets of game outcomes. Additionally, certain central determination gaming systems have been implemented wherein the central system maintains one or more predetermined pools or sets of random number seeds. The use of random number seeds reduces the computational load on the central processor of the central determination gaming systems. In these systems, when a player makes a wager on one of the gaming terminals, the central system selects a seed used for determining the game outcome, marks the selected seed as used and communicates the selected seed to that individual gaming terminal. The individual gaming terminal utilizes the seed to determine the predetermined game outcome. Once a seed is used, it is removed (or prevented from further selection) from the predetermined pool or set and cannot be selected by the central processor upon another wager. It should be appreciated that as players are continuously playing the gaming terminals in a central determination gaming system and a central processor may run hundreds or thousands of individual gaming terminals at once, a pool of outcomes (or a pool of number seeds) for a particular game may include millions of predetermined outcomes (or seeds). Further considering that a plurality of different types of games of different denominations may be played on the thousands of individual gaming terminals and each different game and/or denomination requires it's own pool of outcomes (or seeds), it is contemplated that the central processor may select game outcomes from hundreds of pools of outcomes (or seeds), each including millions of outcomes (or seeds). Therefore, it should be appreciated that central determination gaming systems have substantial data storage needs.

There are a number of advantages to providing for centralized production seeds which are used for determining game outcomes at individual terminals. Central production or control can assist a casino or other entity in maintaining appropriate records, controlling gaming, reducing and preventing cheating or electronic or other errors, reducing or eliminating win-loss volatility and the like. However, one problem with central determination gaming systems is the constant and continuous need to provide accurate validated pools of seeds for use by the central determination gaming system.

SUMMARY OF THE INVENTION

The present invention provides an apparatus and method for generating one or more pools or sets of seeds for use in a central determination gaming system. In one embodiment of the present invention, a processor of the apparatus or seed generator randomly generates a predetermined number of random number seeds. In one embodiment, these seeds are generated in substantially identical fashion as to how game outcomes are determined by a probability-based gaming device. Thus, the generated set of seeds generally mirrors a set of game outcomes generated by a probability-based gaming terminal. Each generated seed is deterministic of a game outcome value. For example, one seed may be used by a gaming terminal to determine a win outcome with a value of $2, while another seed may be used by the gaming terminal to determine a loss outcome with a value of zero. Other suitable methods of generating the number of random seeds may be employed in accordance with the present invention.

After the predetermined number of seeds are generated, the processor simulates the game outcome value that each generated seed ultimately determines. This simulation is accomplished by the processor utilizing each generated seed in a random number generating algorithm to determine at least one and preferably a plurality of random numbers. The processor then uses the generated random numbers to determine the appropriate game outcome for each seed.

Having simulated a game outcome value for each generated seed, the processor determines if the set of seeds satisfies a required condition or criteria. In an alternative embodiment, the processor determines if the set of seeds satisfies a plurality of different conditions or criteria. Examples of the different criteria or conditions include, but are not limited to: (i) a total payback percentage or sum for the pool or set as a whole; (ii) the number of seeds in the generated pool or set; (iii) a minimum number of seeds that are deterministic for one game outcome value; (iv) a maximum number of seeds that are deterministic for one game outcome value; (v) a minimum number of seeds that are deterministic for a plurality of game outcome values; (vi) a maximum number of seeds that are deterministic for a plurality of game outcome values; (vii) a number of seeds that are deterministic for each game outcome value; (viii) an average payout of the game outcome values that are determined by the seeds in the set; and (ix) a number of seeds that provide a bonus or secondary game outcome.

If the required conditions or criteria are satisfied, the set is complete and ready for use in a central determination gaming system. It should be appreciated that once complete, the set of seeds may be stored in a memory device until requested by the processor of the central determination gaming system. If the required conditions or criteria are not satisfied, the processor modifies the generated set of seeds. This modification is accomplished by the processor randomly selecting a seed from the set of seeds. The selected seed is removed from the set and a new randomly generated seed is added to the set. The game outcome value for the modified set is simulated as described above. The processor then determines if the modified set of seeds is closer to satisfying the required conditions or criteria. If the modified set of seeds is not closer to satisfying the required conditions or criteria, the new randomly generated seed is removed from set of seeds and replaced by another new randomly generated seed as described above. If the modified set of seeds is closer to satisfying the required conditions or criteria, the new generated seed is added to the seed set and the processor again determines if the required conditions or criteria are satisfied. If the required conditions or criteria are satisfied, the set is complete and ready for use in a central determination gaming system. If the required conditions or criteria are not satisfied, the processor continues modifying the set of seeds as described above, until the required conditions or criteria are satisfied.

In one preferred embodiment of the present invention, the required criteria is that the sum of the simulated game outcome values must equal or be within an acceptable range of a predetermined sum. The predetermined sum is the guaranteed total payback amount for the set as a whole. In this embodiment, after simulating the game outcome value for each generated seed, the processor computes a sum of all the simulated game outcome values and compares the computed sum to the predetermined sum.

If the sum of all the game outcome values is equal to or within an acceptable range of the predetermined sum, the set of seeds is complete and ready for use in a central determination gaming system. If the sum of all the game outcome values is not equal to or within an acceptable range of the predetermined sum, the processor randomly selects and removes a seed from the generated set of seeds. The processor randomly generates a new seed and simulates the game outcome value for the new seed as described above. The processor computes a modified sum of the new simulated game outcome value and the game outcome values simulated from the remaining seeds in the set. If the modified sum is not closer to the predetermined sum than the sum of the game outcome value simulated from the removed seed and the game outcome values simulated from the remaining seeds in the set, the new seed is discarded and another seed is randomly generated. The game outcome value for the new seed is simulated and another modified sum is computed using the newly simulated game outcome value and the game outcome values simulated from the remaining seeds in the set. This process is repeated until the modified sum is closer to the predetermined sum than the sum of the game outcome value simulated from the removed seed and the game outcome values simulated from the remaining seeds in the set.

If the modified sum is closer to the predetermined sum than the sum of the game outcome value simulated from the removed seed and the game outcome values simulated from the remaining seeds in the set, the processor adds the newly generated seed to the set of seeds. The processor compares the modified sum to the predetermined sum. If the modified sum is equal to or within an acceptable range of the predetermined sum, the set of seeds is complete and ready for use in a central determination gaming system. If the modified sum is not equal to or within an acceptable range of the predetermined sum, another seed is randomly selected and removed from the set of seeds. A new seed is generated and as described above is added to the set of seeds if the modified sum of the game outcome value simulated from the new seed and the game outcome values simulated from the remaining seeds in the set is closer to the predetermined sum than the sum of the game outcome value simulated from the removed seed and the game outcome values simulated from the remaining seeds in the pool, as described above. This process is repeated until the modified sum is exactly equal to or within an acceptable range of the predetermined sum.

Additional features and advantages of the present invention are described in, and will be apparent from, the following Detailed Description of the Invention and the figures.

DETAILED DESCRIPTION OF THE INVENTION

The present invention includes an apparatus and method for generating a set of seeds for a central determination gaming system.

Figure 1:
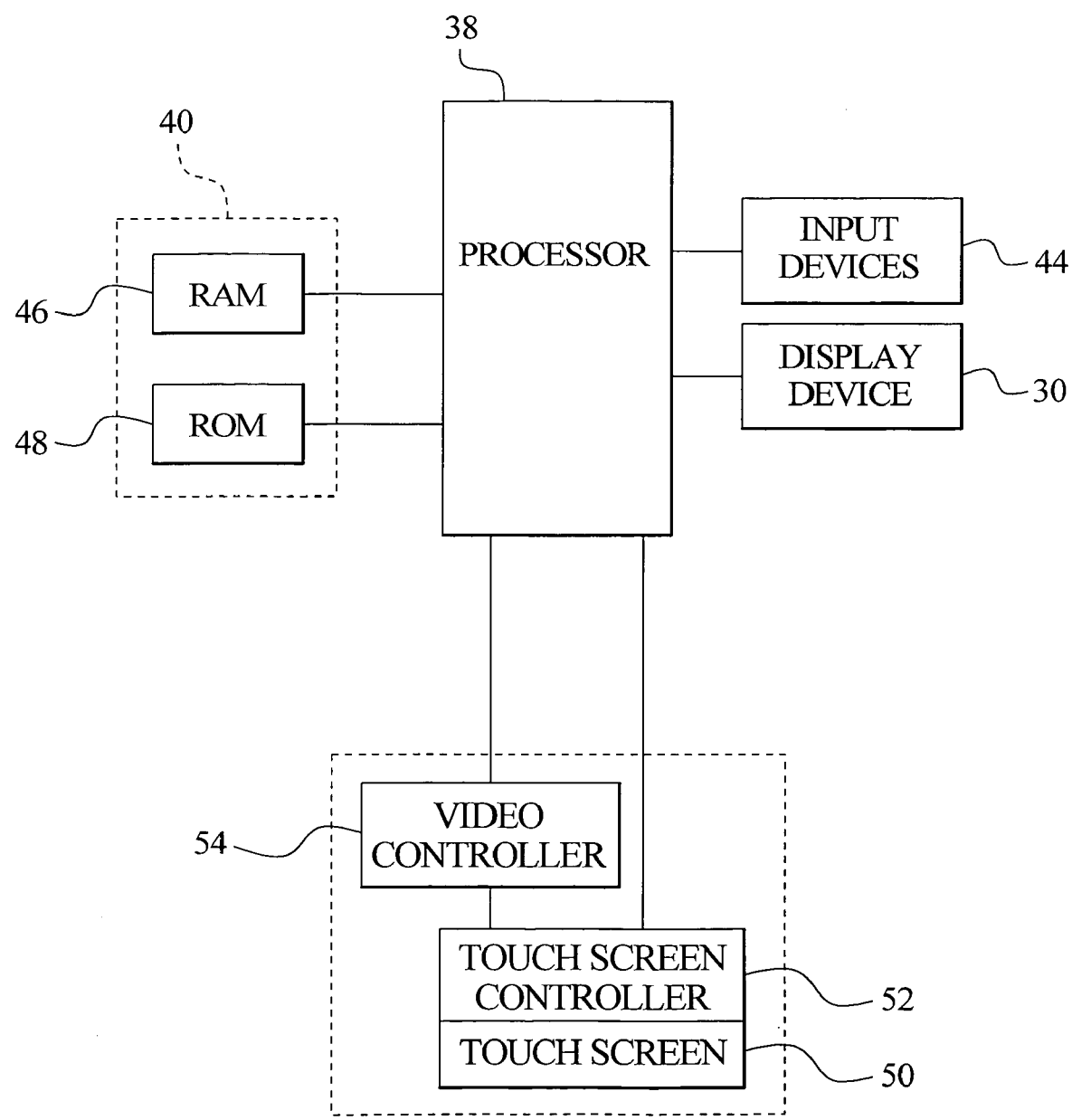
FIG. 1 is a schematic block diagram of an electronic configuration of one embodiment of the seed generator of the present invention.

Referring now to FIG. 1, the general electronic configuration of the apparatus or seed generator preferably includes: a processor 38; one or more input devices 44; a memory device 40 for storing program code or other data specifically including pools of generated seeds as discussed below and a central display device 30. The processor 38 in one embodiment includes a microprocessor or microcontroller-based platform which is capable of displaying images, numbers, tables, symbols and other indicia. The memory device 40 can include random access memory (RAM) 46 for storing event data or other data generated or used during the generation of a pool of seeds. The memory device 40 can also include read only memory (ROM) 48 for storing program code which controls the seed generator so that it generates a particular set of seeds in accordance with applicable game rules and pay tables as discussed below. It should be appreciated that although a processor 38 and memory device 40 are preferable implementations of the present invention, the present invention can also be implemented using one or more application-specific integrated circuits (ASIC's) or other hard-wired devices (collectively and/or alternatively referred to herein as a "processor"). Furthermore, although the processor 38 and memory device 40 preferably reside in each seed generator, it is possible to provide some or all of their functions at a central location such as a network server for communication to a central determination gaming system, such as over a local area network (LAN), wide area network (WAN), Internet connection, microwave link, and the like.

As illustrated in FIG. 1, in one embodiment the operator uses the input devices 44 to enter conditions or criteria required of the generated pool of seeds. In certain instances it is preferable to use a touch screen 50 and an associated touch screen controller 52 instead of a conventional video monitor display device. Touch screen 50 and touch screen controller 52 are connected to a video controller 54 and processor 38. An operator can make decisions and input signals into the seed generator by touching touch screen 50 at the appropriate places.

In an alternative embodiment, the processor 38 of the seed generator is operable to obtain the required conditions or criteria from suitable data stored in the memory device 40. In this embodiment, upon suitable request or input signal, such as a request from the central processor of the central determination gaming system to generate a set of seeds for a particular game, the processor of the seed generator obtains the required conditions or criteria from the memory device and begins generating the requested set of seeds. This embodiment enables the operator of the seed generator to input the required conditions or criteria for each set of seeds one time, as opposed to the inputting the required conditions or criteria for each time each set of seeds is generated.

In one embodiment, after each set of seeds is generated, it is communicated to the central determination system. In another embodiment, each completed set is stored until requested by the central processor of the central determination gaming system. In another embodiment, the seed generator is situated in a location distinct from the central determination gaming system. As different entities may operate the seed generator and the central determination gaming system, it is contemplated that each generated set of seeds may be generated by the seed generator and then communicated, either immediately or after being stored in a memory device, to the central determination system. In this embodiment, the central determination gaming system is operable to communicate with the seed generator and request additional sets of seeds when a predetermined number of outcomes are used from a set.

The central processor of the central determination gaming system may control thousand of gaming terminals and dispense millions of seeds to the individual gaming terminals. The central processor may thus be in continuous need for new sets of seeds. To accommodate this need, the seed generator is capable of continuously generating and storing sets of seeds to be used by the central determination system. In one embodiment, the generated sets of seeds are stored in the memory device of the seed generator. In another embodiment, after the seed generator generates a complete seed set for use in the central determination gaming system, the complete seed set may be communicated from the seed generator to an intermediate memory or storage device. Storing each completed seed pool or seed set at either the seed generator or an intermediate memory device enables the central determination gaming system to avoid using memory in maintaining the pools or sets of seeds until such pools or sets are needed. In these embodiments, each completed set of seeds is stored in a memory device until requested by the central processor of the central determination gaming system. In an alternative embodiment, the processor of the seed generator maintains an inventory of all the stored sets of seeds. When the processor determines that the number of a specific stored set of seeds is lower than a predetermined level, the processor generates another set of seeds for storage in a memory device. This embodiment provides that the central determination system will not cease to function due to a lack of available seed sets.

The generated set of seeds can be configured to include at least one condition or criteria. Alternatively, the generated set of seeds can be configured to include a plurality of different conditions or criteria. The conditions or criteria can be designated by the operator of the seed generator. Examples of the different criteria or conditions or criteria include, but are not limited to (i) a total payback percentage or sum for the pool or set as a whole; (ii) the number of seeds in the generated pool or set; (iii) a minimum number of seeds that are deterministic for one game outcome value; (iv) a maximum number of seeds that are deterministic for one game outcome value; (v) a minimum number of seeds that are deterministic for a plurality of game outcome values; (vi) a maximum number of seeds that are deterministic for a plurality of game outcome values; (vii) a number of seeds that are deterministic for each game outcome value; (viii) an average payout of the game outcome values that are determined by the seeds in the set; and (ix) a number of seeds that provide a bonus or secondary game outcome. It should be appreciated that in a central determination gaming system that implements an instant-type lottery game, unless the criteria requires the number of seeds that are deterministic for each game outcome value, the total payback sum is a preferred criteria. This is, without requiring the exact number of seeds that are deterministic for each game outcome value, requiring a total payback amount guarantees that a certain amount wagered is paid back to the players as required in an instant-type lottery game.

Figure 2:
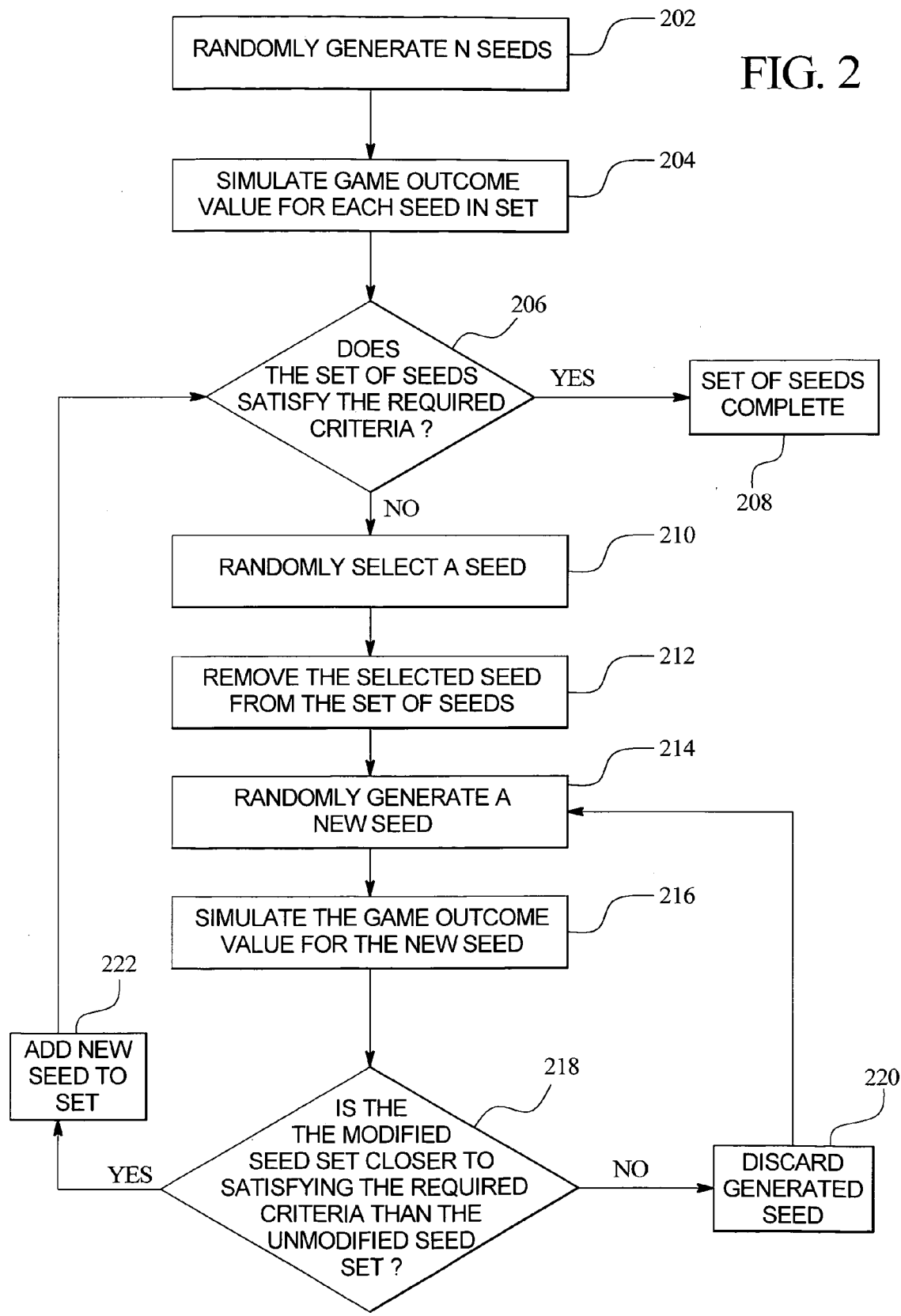
FIG. 2 is a schematic block diagram illustrating one embodiment of the present invention wherein the set of seeds is configured to satisfy a required condition.

Referring to FIG. 2, in one embodiment of the present invention, the processor of the seed generator randomly generates a predetermined number of random number seeds as indicated in block 202. The number of seeds generated is equal to the number of game outcomes that will be included in the pool of game outcomes for use in the central determination gaming system. This number may be predetermined, inputted by the operator of the seed generator or randomly determined. Each seed is unique and is deterministic of a game outcome value. That is, for any given seed, it is possible to determine what game outcome will result from the seed for a particular type of game. For example, one seed may be used by a gaming terminal to determine a win outcome with a value of $2, while another seed may be used by the gaming terminal to determine a loss outcome with a value of $0. A plurality of different seeds may each determine the same game outcome value. It should be appreciated that while a plurality of different seeds may each determine the same game outcome value, the presentation to the player is preferably distinct for each seed. For example, while two seeds for a slot machine type game may each determine a win game outcome with a value of $2, each game outcome may be presented to the player as a different combination of reel symbols.

The seeds are generated in an identical fashion as to how game outcomes are determined by a probability-based gaming terminal. That is, the same probability data and program that a gaming terminal uses to generate game outcomes is used to generate each seed. For example, a probability-based gaming terminal may be programmed to payback 95% of all wagers placed with a 1% chance of generating a $10 win outcome, a 5% chance of generating a $5 win outcome, a 10% chance of generating a $2 win outcome, a 40% chance of generating a $1 win outcome and a 44% chance of generating a $0 loss outcome. However, when one hundred game outcomes are generated by the probability-based gaming terminal, the actual payback may be 137% of all wagers placed and the actual generated outcomes may be six $10 win outcomes, one $5 win outcome, eighteen $2 win outcomes, thirty-six $1 win outcomes and thirty-nine $0 loss outcomes. Similar to how a probability-based gaming terminal generates outcomes, the seed generator generates a set of seeds. For example, a seed generator may be programmed with a 1% chance of generating a seed that determines a $10 win outcome, a 5% chance of generating a seed that determines a $5 win outcome, a 10% chance of generating a seed that determines a $2 win outcome, a 40% chance of generating a seed that determines a $1 win outcome and 44% chance of generating a seed that determines a $0 loss outcome. However, as with a probability-based gaming terminal, when a set of one hundred seeds are generated by the seed generator, the actual generated seeds may be six seeds that determine a $10 win outcome, one seed that determines a $5 win outcome, eighteen seeds that determine a $2 win outcome, thirty-six seeds that determine a $1 win outcome and thirty-nine seeds that determine a $0 loss outcome. This method of generating seeds enables the generated set of seeds to mirror a set of game outcomes generated by an individual probability-based gaming terminal. It should be appreciated that the probability data and program can be modified for a specific game and/or a specific paytable.

As illustrated in FIG. 2, the processor of the seed generator simulates the game outcome value that each seed in the set determines as indicated in block 204. This simulation is accomplished in an identical fashion to how a gaming terminal utilizes a random number seed to determine a game outcome. That is, the processor utilizes each generated seed in a random number generating algorithm to generate at least one and preferably a plurality of random numbers. The generated random numbers are then used by the processor to calculate the specific game outcome value. In one embodiment simulating a slot machine gaming terminal, the seed generator may utilize a first random number to simulate the reel stop position (i.e., the symbol displayed on the stopped reel) of a first reel, a second random number to simulate the reel stop position of a second reel and a third random number to simulate the reel stop position of a third reel. With reference to an appropriate pay table, the processor then calculates the specific game outcome value that is associated with the simulated combination of stopped reel symbols. In another embodiment, the processor may utilize the first generated random number to calculate the specific game outcome value and each additional generated random number to determine how the calculated game outcome value will be presented to the player. For example, simulating a slot machine gaming terminal, the processor may utilize a generated seed to produce four random numbers. The processor uses the first generated random number to calculate the specific game outcome value. The processor uses the second, third and fourth generated random numbers to determine the combination of stop reel symbols for the slot machine.

Having simulated a game outcome value for each generated seed, the processor determines if the set of seeds satisfies the required conditions or criteria as indicated in diamond 206. If the required conditions or criteria are satisfied, the set is complete and ready for use in a central determination gaming system as indicated in block 208. It should be appreciated that once complete, the set of seeds may be stored in a memory device until requested by the processor of the central determination gaming system. If the required conditions or criteria are not satisfied, the processor modifies the generated set of seeds. This modification is accomplished by the processor randomly selecting one or more seeds from the set of seeds as indicated in block 210. The selected seeds are removed from the set as indicated in block 212. The processor then randomly generates one or more seeds as indicated in block 214. It should be appreciated that the number of newly generated seeds is equal to the number of the removed seeds. The game outcome values for the newly generated seeds is simulated as indicated in block 216. The processor then determines if the modified seed set (the newly generated seeds and the remaining seeds in the seed set) is closer to satisfying the required criteria than the unmodified seed set (the selected removed seeds and the remaining seeds in the seed set) as indicated in diamond 218. If the modified seed set is not closer to satisfying the required criteria than the unmodified seed set, the new seeds are discarded as indicated in block 220 and the processor randomly generates one or more new seeds as indicated in block 214. If the modified seed set is closer to satisfying the required criteria than the unmodified seed set, the new seeds are added to the set of seeds as indicated in block 220 and the processor determines if the modified set of seeds satisfy the required criteria as indicated in diamond 206. This process is repeated as described above until the required criteria are satisfied. It should be appreciated that the seed generator is capable of generating a plurality of pools or sets of seeds, either simultaneously or one at a time, for use with multiple games in a central determination gaming system. Each set of seeds is preferably different.

Figure 3:
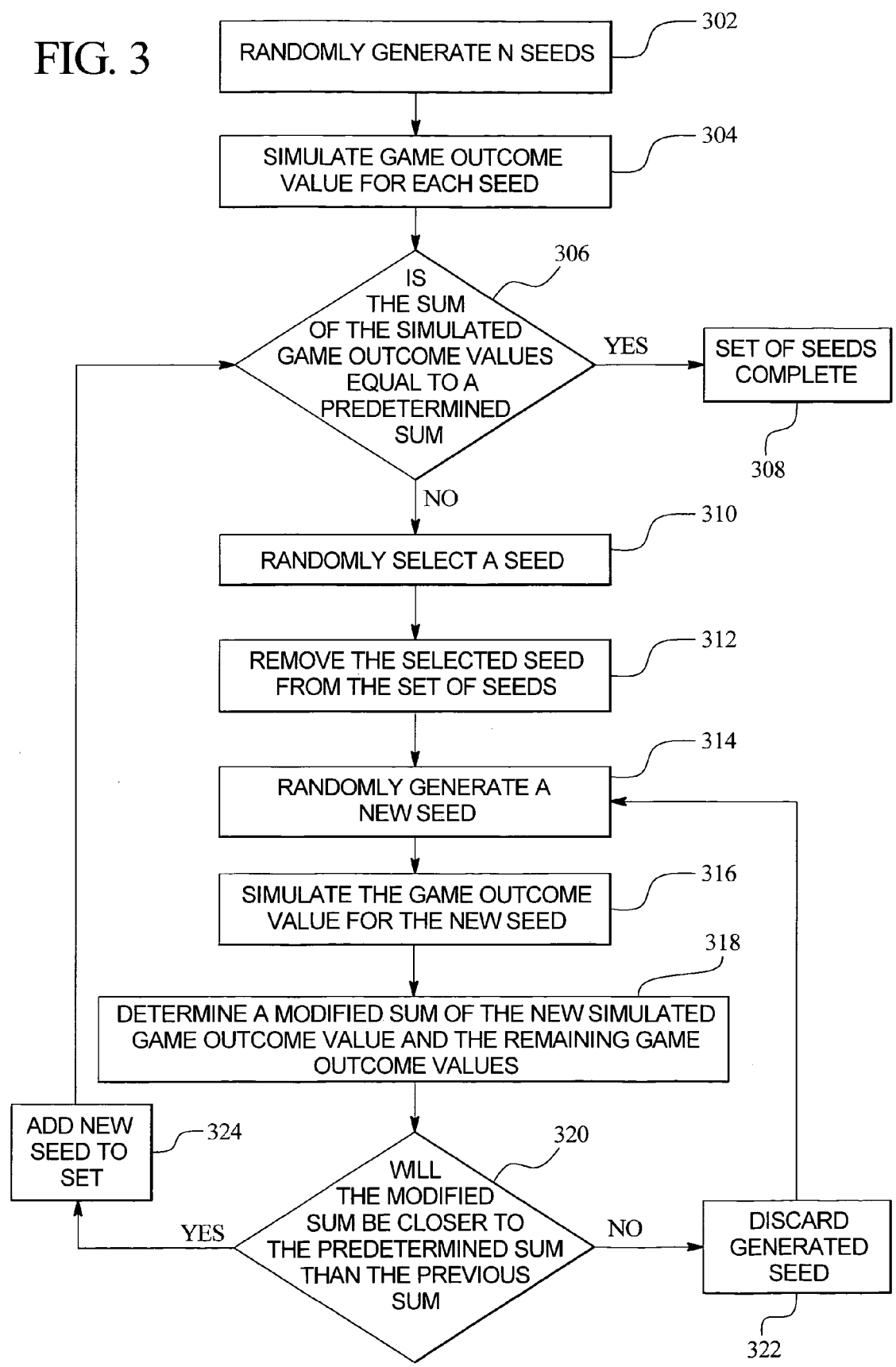
FIG. 3 is a schematic block diagram illustrating another embodiment of the present invention.

In one preferred embodiment of the present invention, the required criteria is that the sum of the simulated game outcome values must equal a predetermined sum. The predetermined sum is the guaranteed total payback amount for the set as a whole. For instance, if a pool for a $1 game has a million outcomes and has a 90% payback, the predetermined sum must be $900,000. In this embodiment as illustrated in FIG. 3, the seed generator randomly generates a predetermined number of seeds and simulates the game outcome value that each seed in the set determines as indicated in blocks 302 and 304, respectively. The processor then adds together all the simulated game outcome values to form an initial sum of the outcome values. The processor then compares the initial sum to the predetermined sum of outcome values as indicated in diamond 306.

If the sum of all the simulated game outcome values is equal to or within an acceptable range of the predetermined sum (i.e., the set of seeds satisfy the required criteria), the set of seeds is complete and ready for use in a central determination gaming system as indicated in block 308. However, since the set of seeds are randomly determined, the sum of all the simulated game outcome values for the set of seeds may be greater than or less than the predetermined sum. For example, if the predetermined sum is $900,000 the sum of all the simulated game outcome values may be $925,000 which is greater than the predetermined sum or the sum may be $845,000 which is lower than the predetermined sum. If the sum of all the game outcome values is not equal to or within an acceptable range of the predetermined sum (i.e., the set of seeds does not satisfy the required criteria), the processor randomly selects one or more seeds from the set of generated seeds as indicated in block 310. The processor removes the selected seeds from the set of seeds as indicated in block 312. The processor then randomly generates one or more seeds as indicated in block 314. The game outcome values for the new seeds is simulated as indicated in block 316. The processor determines a modified sum of the newly simulated game outcome values and the game outcome values simulated from the remaining seeds in the set as indicated in block 318. The modified sum is compared to the previous sum of the simulated game outcome values for the set of seeds as indicated in diamond 320. The previous sum is the sum of the game outcome values simulated from the removed seeds and the game outcome values simulated from the remaining seeds in the set. If the modified sum is not closer to the predetermined sum than the previous sum (i.e., the modified set of seeds in not closer to satisfying the required criteria), the new seeds are discarded as indicated in block 322 and the processor randomly generates one or more new seeds as indicated in block 314. In an alternative embodiment (not shown), if the modified sum is not closer to the predetermined sum than the previous sum, the new seeds are discarded and the previously removed seeds are added back into the set of seeds. In this embodiment, the processor randomly selects one or more seeds from the set, removes these selected seeds and randomly generates new seeds to replace the removed seeds as described above.

If the modified sum is closer to the predetermined sum than the previous sum (i.e., the modified sum is closer to satisfying the required criteria) the new seeds are added to the set of seeds as indicated in block 324 and the processor compares the modified sum to the predetermined sum as indicated in diamond 306. This process is repeated as described above until the required criteria are satisfied and the modified sum is equal to or within an acceptable range of the predetermined sum. It should be appreciated that the processor may mark or flag the newly added seeds. Each marked or flagged seed may not be selected and removed from the seed set in subsequent modifications of the set.

In an alternative embodiment, if the modified sum is not closer to the predetermined sum than the previous sum, the new generated seeds are retained. In this embodiment, the remaining seeds in the set are discarded and the processor generates a new seed to replace each discarded seed. The processor then repeats the process as described above until the modified sum is equal to or within an acceptable range of the predetermined sum.

In another embodiment of the present invention, the required criteria is that the sum of the simulated game outcome values must equal or be within an acceptable range of a predetermined sum and the generated set of seeds includes at least one seed that determines each type of game outcome value. In this embodiment, even if the sum of the game outcome values is equal to or within an acceptable range of the predetermined sum, the generated set will not be complete until at least one seed that determines each type of game outcome value is included in the set. For example, the condition or criteria for the pool of seeds might require that pool of seeds include at least one seed that determines a $0 loss outcome, a $1 win outcome, a $10 win outcome, a $100 win outcome and a $1000 win outcome. In another embodiment illustrating a required condition or criteria, the generated set of seeds must include a predetermined number of seeds that determine each type of game outcome value. For instance, the set of seeds must include one thousand $1 win outcomes, one hundred $10 win outcomes, ten $100 win outcomes and one $1000 win outcome. This embodiment guarantees that the generated set of seeds are deterministic of a discreet set of game outcomes with a specific number of wins, each having a specific value.

In an alternative embodiment, if the set of seeds is within an acceptable range of completion, the processor is operable to bypass the procedure described above and input a predetermined plurality of seeds to replace a plurality of generated seeds in the set. For example, if the criteria for a set of seeds is a predetermined sum of $950,000 and the sum of the set of seeds is currently $900,000, the processor is operable to replace a plurality of the seeds in the set with a plurality of predetermined seeds that have a predetermined sum of $50,000. It should be appreciated that in the previous example, since the current sum is below the predetermined sum, the processor selects a plurality of seeds that are deterministic of $0 loss outcomes and replaces the selected seeds with a plurality of predetermined seeds that bring the current sum closer to or equal to the predetermined sum. In another embodiment, if the set of seeds is within an acceptable range of completion, the processor is operable to enable an operator to manually replace a plurality of generated seeds with a plurality of operator inputted seeds.

Figure 4:
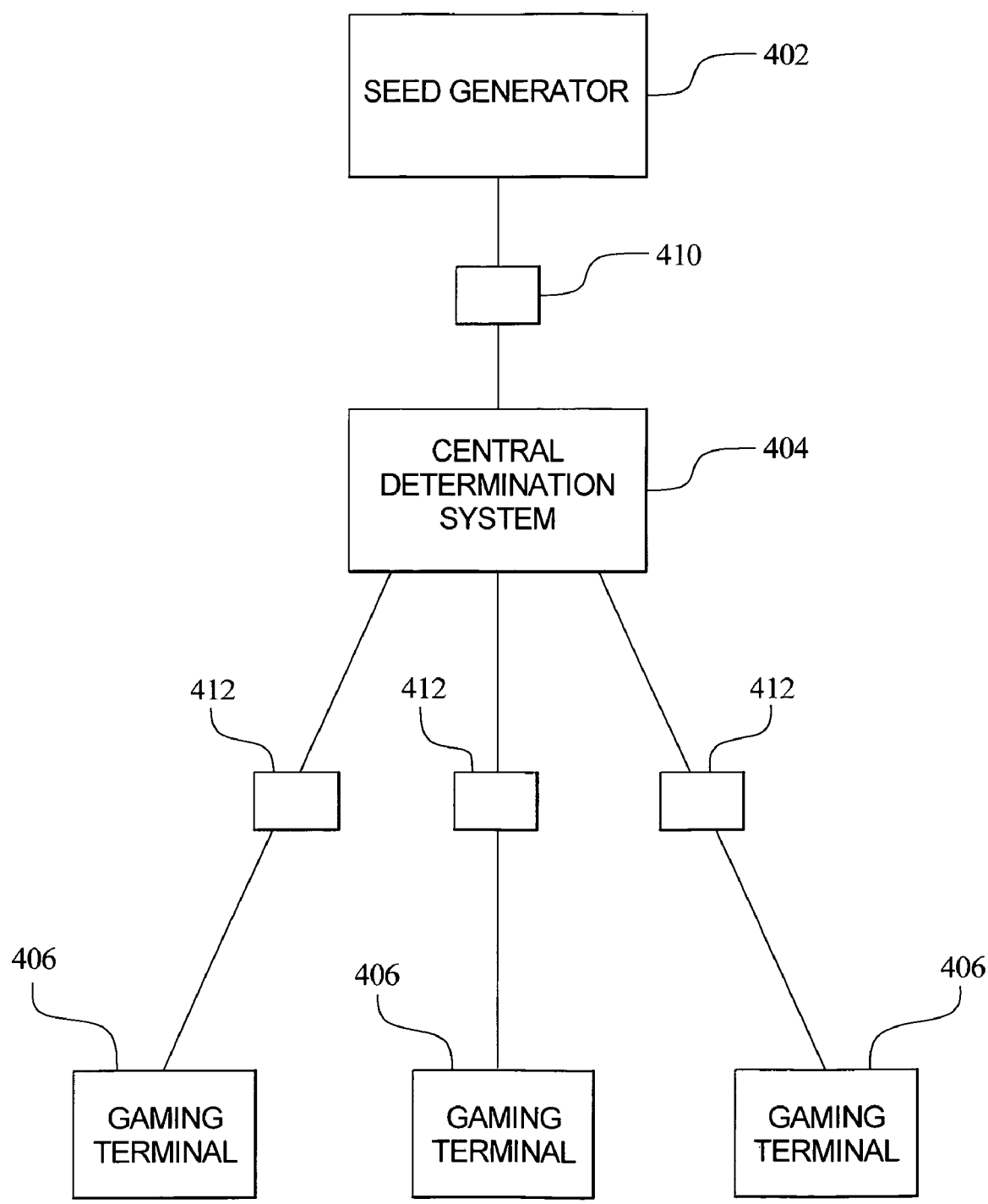
FIG. 4 is a schematic block diagram illustrating the distribution of the generated pool of seeds from the seed generator to the central determination gaming system.

FIG. 4 illustrates the distribution of a complete set of seeds from the storage device of the seed generator to the central determination gaming system. As seen in FIG. 4, after the seed generator has generated and stored a complete set of seeds, upon a request from the central processor of the central determination gaming system, the seed generator 402 sends the complete set of seeds 410 to the central processor 404 via one of more communication links. In an alternative embodiment (not shown), the central processor requests a set of seeds from the intermediate memory device. In this embodiment, the intermediate memory device sends the requested set of seeds to the processor via one or more communication links. The intermediate memory device also notifies the processor of the seed generator which set of seeds was sent. The processor may generate an additional set of seeds to be stored in the intermediate memory device to replace the sent set.

As games are played on the plurality of individual gaming terminals 406, the central processor dispenses individual seeds 412 to the individual gaming terminals, via one or more communication links, and marks each dispensed seed as used. The individual gaming terminals use the dispensed seed to generate a game outcome value to be issued to the player.

While the present invention has been described in connection with what is presently considered to be the most practical and preferred embodiments, it is to be understood that the invention is not limited to the disclosed embodiments, but on the contrary is intended to cover various modifications and equivalent arrangements included within the spirit and scope of the claims. It is thus to be understood that modifications and variations in the present invention may be made without departing from the novel aspects of this invention as defined in the claims, and that this application is to be limited only by the scope of the claims.;

The invention is claimed as follows:

1. A seed set generator for a central determination gaming system, said seed set generator comprising:
    a data storage device;
    a plurality of different criteria for a seed set; and
    a processor operable with the data storage device to:
    (a) obtain said criteria for the seed set;
    (b) randomly generate the seed set, wherein each seed is deterministic of a game outcome value;
    (c) simulate the game outcome value for each seed in the seed set;
    (d) determine if the obtained criteria are satisfied;
    (e) if the obtained criteria are satisfied by said generated seed set, store the generated seed set for distribution to the central determination gaming system; and
    (f) if the obtained criteria are not satisfied by said generated seed set:
        (i) select at least one seed from the seed set,
        (ii) generate at least one new seed,
        (iii) replace the selected seed with the generated new seed, and
        (iv) repeat (d) to (f) at least once.

2. The seed set generator of claim 1, wherein said processor is operable to generate a plurality of seed sets.

3. The seed set generator of claim 2, wherein each seed set is different.

4. The seed set generator of claim 1, wherein one of said criteria includes a number of seeds in said seed set.

5. The seed set generator of claim 1, wherein one of said criteria includes a sum of the simulated game outcome values of the seeds in said seed set.

6. The seed set generator of claim 1, wherein one of said criteria is selected from the group consisting of:
- a minimum number of seeds that are deterministic for a game outcome value;
- a maximum number of seeds that are deterministic for a game outcome value;
- a minimum number of seeds that are deterministic for a plurality of game outcome values; and
- a maximum number of seeds that are deterministic for a plurality of game outcome values.

7. The seed set generator of claim 1, wherein one of said criteria includes a number of seeds that are deterministic for each game outcome value.

8. The seed set generator of claim 1, wherein one of said criteria includes a number of seeds that are deterministic for at least one game outcome value.

9. The seed set generator of claim 8, wherein at least one of the game outcome values may be presented to a player as a plurality of different combinations of reel symbols.

10. The seed set generator of claim 9, wherein one of said criteria includes a number of said different combinations of reel symbols for said at least one game outcome value.

11. The seed set generator of claim 1, wherein one of said criteria includes an average payout of the game outcome values that are determined by the seeds in the generated seed set.

12. The seed set generator of claim 1, wherein one of said criteria includes a number of seeds that provide a secondary game outcome.

13. The seed set generator of claim 1, wherein said seed set is generated based on a plurality of probabilities.

14. The seed set generator of claim 1, wherein said processor is in communication with said central determination gaming system.

15. The seed set generator of claim 1, wherein if the obtained criteria are not satisfied by said generated seed set, said processor is operable to remove the selected seed from the seed set.

16. A seed set generator for a central determination gaming system, said seed set generator comprising:
- a data storage device; and
- a processor operable with the data storage device to:
  - (a) randomly generate a seed set, wherein each seed is deterministic of a game outcome value;
  - (b) determine a predetermined sum and a minimum number of seeds that are deterministic for a plurality of different game outcome values;
  - (c) simulate the game outcome value for each seed in the seed set;
  - (d) determine an initial sum of the simulated game outcome values;
  - (e) compare the sum of the simulated game outcome values to the predetermined sum;
  - (f) determine if at least the determined minimum number of seeds for the plurality of game outcome values are generated;
  - (g) if the sum of the simulated game outcome values is the predetermined sum and at least the determined minimum number of seeds for the plurality of game outcome values are generated, store the generated seed set for distribution to the central determination gaming system; and
  - (h) if the sum of the simulated game outcome values is not the predetermined sum or at least the determined minimum number of seeds for the plurality of game outcome values are not generated:
    - (i) select at least one generated seed from the seed set,
    - (ii) remove the selected seed from the seed set,
    - (iii) generate at least one new seed,
    - (iv) simulate a game outcome value for the new seed,
    - (v) determine a modified sum of the simulated game outcome value for the new seed and the remaining simulated game outcome values,
    - (vi) discard the new generated seed if the modified sum is not closer to the predetermined sum than the initial sum,
    - (vii) add the new generated seed to the seed set if the modified sum is closer to the predetermined sum than the initial sum, and
    - (viii) repeat (e) to (h) at least once.

17. The seed set generator of claim 16, wherein said processor is operable to flag each new generated seed added to the seed set.

18. The seed set generator of claim 17, wherein each flagged seed remains in said seed set.

19. The seed set generator of claim 16, wherein said processor is operable to replace a plurality of seeds from said seed set with a plurality of predetermined seeds.

20. The seed set generator of claim 16, wherein said processor is operable to enable an operator to manually replace a plurality of seeds from said seed set with a plurality of operator inputted seeds.

21. The seed set generator of claim 16, which includes a range of sums, wherein the predetermined sum is within the range of sums.

22. The seed set generator of claim 21, wherein the processor is operable to store the generated seed set if the sum of the simulated game outcome values is within the range of sums.

23. The seed set generator of claim 16, which includes a range of numbers that are deterministic for a plurality of game outcome values, wherein the minimum number of seeds is the lowest number in said range.

24. The seed set generator of claim 23, wherein the range of numbers includes a maximum number of seeds that are deterministic for a plurality of game outcome values, wherein the maximum number is the highest number in the range.

25. The seed set generator of claim 16, wherein the processor is operable to store the generated seed set if the sum of the simulated game outcome values is the predetermined sum and the number of generated seeds are within the range of numbers that are deterministic for a plurality of game outcome values.

26. The seed set generator of claim 16, wherein at least one of the game outcome values may be presented to a player as a plurality of different combinations of reel symbols.

27. A central determination gaming system seed set generator comprising:
- a randomly generated seed set, wherein said seed set includes a plurality of seeds which are each deterministic of a game outcome;
- a plurality of different criteria for the seed set;
- at least one game outcome simulation sequence, wherein said simulation sequence includes simulating the game outcome for at least a plurality of the seeds in the seed set; and
- at least one modification sequence if said plurality of criteria are not satisfied by the simulated game outcomes of the generated seed set, wherein said modification sequence includes modifying the generated seed set such that said plurality of criteria are closer to being satisfied by the modified seed set than by the unmodified seed set.

28. The seed set generator of claim 27, wherein said modification sequence includes replacing at least one generated seed with another newly generated seed.

29. The seed set generator of claim 27, wherein said modification sequence includes removing at least one generated seed in said seed set.

30. The seed set generator of claim 27, wherein said modification sequence includes adding at least one newly generated seed to said seed set.

31. The seed set generator of claim 27, wherein one of said criteria includes a number of seeds in said seed set.

32. The seed set generator of claim 27, wherein each game outcome is associated with a value and one of said criteria includes a sum of the values of the game outcomes simulated from the seeds in the seed set.

33. The seed set generator of claim 27, wherein one of said criteria is selected from the group consisting of:
a minimum number of seeds that are deterministic for a game outcome;
a maximum number of seeds that are deterministic for a game outcome;
a minimum number of seeds that are deterministic for a plurality of game outcomes; and
a maximum number of seeds that are deterministic for a plurality of game outcomes.

34. The seed set generator of claim 27, wherein one of said criteria includes a number of seeds that are deterministic for each game outcome.

35. The seed set generator of claim 27, wherein one of said criteria includes a number of seeds that are deterministic for at least one game outcome.

36. The seed set generator of claim 35, wherein at least one of the game outcome values may be presented to a player as a plurality of different combinations of reel symbols.

37. The seed set generator of claim 36, wherein one of said criteria includes a number of said different combinations of reel symbols for said at least one game outcome value.

38. The seed set generator of claim 27, wherein one of said criteria includes an average payout of the game outcome values that are determined by the seeds in the generated seed set.

39. The seed set generator of claim 27, wherein one of said criteria includes a number of seeds that provide a secondary game outcome.

* * * * *